(12) United States Patent
Shirase et al.

(10) Patent No.: US 10,068,821 B2
(45) Date of Patent: Sep. 4, 2018

(54) SEMICONDUCTOR COMPONENT SUPPORT AND SEMICONDUCTOR DEVICE

(71) Applicant: NICHIA CORPORATION, Anan-shi (JP)

(72) Inventors: Takeaki Shirase, Anan (JP); Toru Hashimoto, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 205 days.

(21) Appl. No.: 13/944,837

(22) Filed: Jul. 17, 2013

(65) Prior Publication Data
US 2014/0021595 A1   Jan. 23, 2014

(30) Foreign Application Priority Data
Jul. 18, 2012   (JP) .................................. 2012-160043

(51) Int. Cl.
*H01L 23/06* (2006.01)
*H01L 23/13* (2006.01)
(Continued)

(52) U.S. Cl.
CPC ............ *H01L 23/13* (2013.01); *H01L 23/293* (2013.01); *H01L 23/49503* (2013.01);
(Continued)

(58) Field of Classification Search
CPC . H01L 2924/01078; H01L 2924/01079; H01L 2224/48091; H01L 23/48; H01L 23/12; H01L 23/13; H01L 23/49503; H01L 23/495; H01L 21/565; H01L 23/3107; H01L 33/62; H01L 33/486; H01L 21/4828
(Continued)

(56) References Cited

U.S. PATENT DOCUMENTS 5,021,865 A * 6/1991 Takahashi ......... H01L 23/49503
                                                     257/676
5,661,338 A * 8/1997 Yoo ................... H01L 23/49503
                                                     257/649
(Continued)

FOREIGN PATENT DOCUMENTS

JP          50-6151 B1      3/1975
JP          63-84124        4/1988
(Continued)

OTHER PUBLICATIONS

Extended European Search Report for corresponding EP Application No. 13176849.1-1552, dated Jul. 8, 2016.

*Primary Examiner* — Kenneth Parker
*Assistant Examiner* — Young W Kim
(74) *Attorney, Agent, or Firm* — Mori & Ward, LLP

(57) ABSTRACT

A semiconductor component support is provided which includes a component support portion for a semiconductor component to be mounted on the semiconductor component support portion. The component support portion includes a metal part that includes an opening in plan view. The opening of the metal part includes first and second sections. The second section communicates with the first section, and is arranged outside the first section. The second section is wider than the first section. The first section can be at least partially positioned directly under a mount-side main surface of the semiconductor component.

31 Claims, 4 Drawing Sheets

(51) Int. Cl.
    *H01L 23/495*     (2006.01)
    *H01L 23/00*     (2006.01)
    *H01L 23/29*     (2006.01)
    *H01L 33/62*     (2010.01)

(52) U.S. Cl.
CPC ........ H01L 23/49513 (2013.01); H01L 24/32 (2013.01); *H01L 33/62* (2013.01); *H01L 2224/04026* (2013.01); *H01L 2224/05611* (2013.01); *H01L 2224/05624* (2013.01); *H01L 2224/05639* (2013.01); *H01L 2224/05644* (2013.01); *H01L 2224/05655* (2013.01); *H01L 2224/05664* (2013.01); *H01L 2224/05666* (2013.01); *H01L 2224/05669* (2013.01); *H01L 2224/05684* (2013.01); *H01L 2224/293* (2013.01); *H01L 2224/2912* (2013.01); *H01L 2224/29109* (2013.01); *H01L 2224/29111* (2013.01); *H01L 2224/29113* (2013.01); *H01L 2224/29118* (2013.01); *H01L 2224/29139* (2013.01); *H01L 2224/29144* (2013.01); *H01L 2224/29147* (2013.01); *H01L 2224/32014* (2013.01); *H01L 2224/32056* (2013.01); *H01L 2224/32059* (2013.01); *H01L 2224/32225* (2013.01); *H01L 2224/32245* (2013.01); *H01L 2224/45144* (2013.01); *H01L 2224/48091* (2013.01); *H01L 2224/48611* (2013.01); *H01L 2224/48624* (2013.01); *H01L 2224/48639* (2013.01); *H01L 2224/48644* (2013.01); *H01L 2224/48655* (2013.01); *H01L 2224/48664* (2013.01); *H01L 2224/48666* (2013.01); *H01L 2224/48669* (2013.01); *H01L 2224/48684* (2013.01); *H01L 2224/49175* (2013.01); *H01L 2224/73265* (2013.01); *H01L 2224/83138* (2013.01); *H01L 2224/83143* (2013.01); *H01L 2224/83385* (2013.01); *H01L 2224/83424* (2013.01); *H01L 2224/83439* (2013.01); *H01L 2224/83444* (2013.01); *H01L 2224/83447* (2013.01); *H01L 2224/83473* (2013.01); *H01L 2224/83805* (2013.01); *H01L 2224/83815* (2013.01); *H01L 2924/01322* (2013.01); *H01L 2924/10161* (2013.01); *H01L 2924/10162* (2013.01); *H01L 2924/12041* (2013.01); *H01L 2924/12042* (2013.01); *H01L 2924/1301* (2013.01); *H01L 2924/1304* (2013.01); *H01L 2924/1576* (2013.01); *H01L 2924/15151* (2013.01); *H01L 2924/15156* (2013.01); *H01L 2924/15165* (2013.01); *H01L 2924/15724* (2013.01); *H01L 2924/15738* (2013.01); *H01L 2924/15747* (2013.01); *H01L 2924/15787* (2013.01); *H01L 2924/15788* (2013.01); *H01L 2924/181* (2013.01); *H01L 2924/20107* (2013.01); *H01L 2924/20108* (2013.01); *H01L 2924/3025* (2013.01); *H01L 2924/3641* (2013.01); *H01L 2924/3656* (2013.01)

(58) Field of Classification Search
USPC ... 257/E23.104, E33.056, E33.075, 99, 676, 257/684, 689, 711, 712, 296, 649, 666, 257/669, 670; 438/26, 29, 121, 122, 123
See application file for complete search history.

(56) References Cited

U.S. PATENT DOCUMENTS

| | | | | |
|---|---|---|---|---|
| 5,712,507 | A * | 1/1998 | Eguchi | H01L 23/49503 257/666 |
| 5,744,224 | A | 4/1998 | Takeuchi et al. | |
| 5,903,048 | A * | 5/1999 | Bandou | H01L 21/565 257/670 |
| 7,012,324 | B2 * | 3/2006 | Li | H01L 23/49503 257/669 |
| 7,834,429 | B2 * | 11/2010 | Uematsu | H01L 23/49503 257/666 |
| 7,964,942 | B2 * | 6/2011 | Shirasaka | H01L 23/49503 257/676 |
| 2005/0242424 | A1 | 11/2005 | Isokawa | |
| 2008/0150163 | A1 | 6/2008 | Ohse et al. | |
| 2010/0044747 | A1 | 2/2010 | Tanaka | |
| 2010/0244214 | A1 * | 9/2010 | Arita | H01L 23/3107 257/676 |

FOREIGN PATENT DOCUMENTS

| | | |
|---|---|---|
| JP | 03-209731 | 9/1991 |
| JP | 05-082706 | 4/1993 |
| JP | 05-90967 U | 12/1993 |
| JP | 08-204239 | 8/1996 |
| JP | 10-050734 | 2/1998 |
| JP | 10-335795 | 12/1998 |
| JP | 11-031876 | 2/1999 |
| JP | 11-168235 | 6/1999 |
| JP | 2003-338640 | 11/2003 |
| JP | 2004-214338 | 7/2004 |
| JP | 2008-192949 | 8/2008 |
| JP | 2010-531738 | 9/2010 |
| WO | WO 97/13275 | 4/1997 |
| WO | WO 2008/120606 | 10/2008 |
| WO | WO 2009/002536 | 12/2008 |

* cited by examiner

SEMICONDUCTOR COMPONENT SUPPORT AND SEMICONDUCTOR DEVICE

BACKGROUND OF THE INVENTION

1. Field of the Invention

The present invention relates to a support for a semiconductor component, and a semiconductor device that includes this support.

2. Description of the Related Art

In conventional production methods of semiconductor devices, a bonding material such as soldering paste is often applied on a component-mounting portion of a mounting member. After a semiconductor component is placed on the bonding material, the bonding material is melted and then solidified. Subsequently, the semiconductor component is enclosed by a sealing material. When the bonding material is melted and then solidified, if gas (e.g., volatile compound of flux) cannot be sufficiently removed from the bonding material between the semiconductor component and the component mounting portion, voids will appear in the bonding material.

If voids appear, the connection area between the semiconductor component and the component mounting portion will be small. Accordingly, the heat may not be sufficiently dissipated from the semiconductor component. As a result, the reliability of the semiconductor component may be reduced.

As one of examples that address this, for example, Laid-Open Patent Publication No. JP H11-031,876 A (1999) discloses a circuit board that a connection pattern to be joined to a connection film of a semiconductor component by soldering, and a groove that has at least one end that reaches or extends beyond the periphery of the connection pattern. The connection film is formed on the bottom surface of the semiconductor component. An electrically insulating base is exposed through the groove from the connection pattern.

However, the groove disclosed in JP H11-031,876 A is formed in a straight shape having a constant width. This groove may often cause positional deviation or inclination of the semiconductor component.

The present invention is aimed at solving the above problem, and its object is to provide a semiconductor component support and a semiconductor device that surely provide a large connection area of a semiconductor component, and can surely position the semiconductor component at a desired position or orientation.

SUMMARY OF THE INVENTION

To achieve the above object, a semiconductor component support according to an aspect of the present invention includes a component support portion for a semiconductor component to be mounted on the semiconductor component support portion. The component support portion includes a metal part that includes an opening in plan view. The opening of the metal part includes first and second sections. The second section communicates with the first section, and is arranged outside the first section. The second section is wider than the first section. The first section can be at least partially positioned directly under a mount-side main surface of the semiconductor component. A semiconductor component support according to another aspect of the present invention includes a component support portion for a semiconductor component to be mounted on the semiconductor component support portion. The component support portion includes a metal part that includes an opening in plan view. The component support portion includes a metal part that includes at least two pairs of openings in plan view. One of the pairs of openings are arranged at symmetrical locations with respect to the center vertical line of the component support portion, and another pair of openings are arranged at symmetrical locations with respect to the center horizontal line of the component support portion. Each of the openings includes first and second sections. The second section communicates with the first section, and is arranged outside the first section. The second section is wider than the first section. Each first section is at least partially arranged inside one rectangular outline.

In addition, the semiconductor component support according to the present invention can have the following features.

A part of the outline of the second section can agree with the outline of the mount-side main surface of the semiconductor component.

Two or more second sections can be provided as the second section, and can partially agree with the one rectangular outline.

The second section can be formed on the outermost area of the component support portion.

The second section can extend toward the both sides from the first section.

The first section can extend toward the center of the component support portion.

The first section can extend in a straight shape.

The opening cannot divide the metal part. In other words, the metal part can be formed in a single part.

A plurality of openings can be formed as the opening, and the openings can be arranged at symmetrical locations with respect to the center line of the component support portion.

The component support portion can have a roughly rectangular shape in plan view. The second section can be formed on the outermost area of the component support portion, and be spaced away from corners of the metal part.

The semiconductor component support can further include an electrically insulating base that holds the component support portion on the electrically insulating base. The base can have a recessed part or a through hole that is positioned directly under the opening.

A semiconductor device according to another aspect of the present invention includes the above semiconductor component support, and a semiconductor component that is arranged on or above the component support portion of this semiconductor component support.

According to the present invention, it is possible to surely provide a large connection area of a semiconductor component, and to surely position the semiconductor component at a desired position or orientation.

The above and further objects of the present invention as well as the features thereof will become more apparent from the following detailed description to be made in conjunction with the accompanying drawings.

DETAILED DESCRIPTION OF THE EMBODIMENT(S)

The following description will describe embodiments according to the present invention with reference to the drawings. It should be appreciated, however, that the embodiments described below are illustrations of a semiconductor component support and a semiconductor device to give a concrete form to technical ideas of the invention, and a semiconductor component support and a semiconductor device of the invention are not specifically limited to description below. Additionally, the sizes and the arrangement relationships of the members in each of drawings are occasionally shown larger exaggeratingly for ease of explanation.

First Embodiment

Figure 1A:
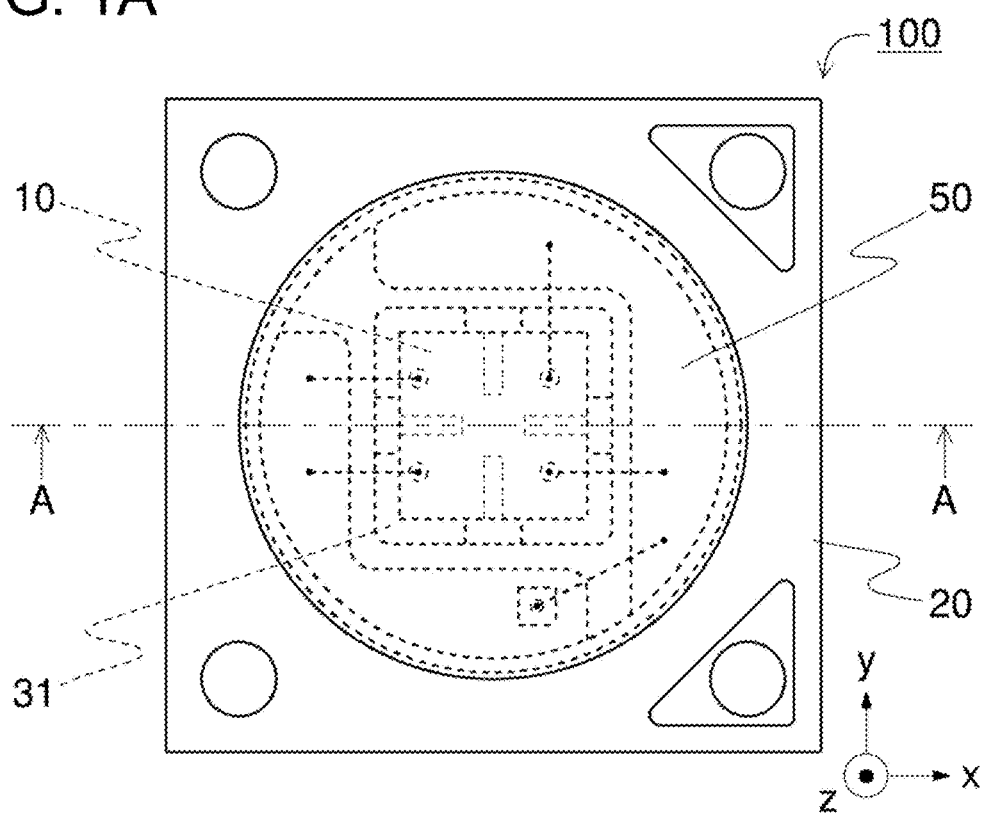
FIG. 1A is a plan view schematically showing a semiconductor device according to an embodiment of the present invention.
Figure 1B:
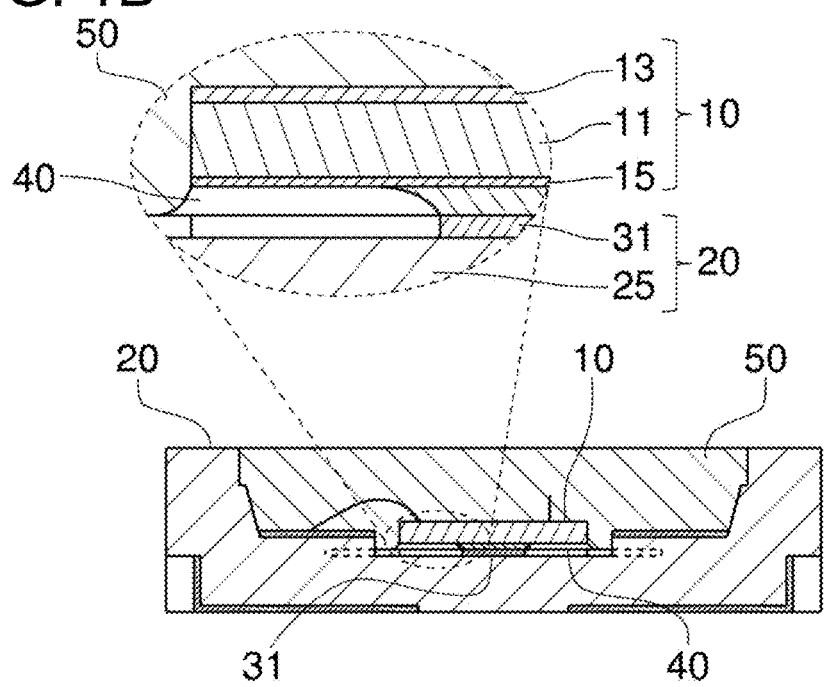
FIG. 1B is a cross-sectional view of the semiconductor device taken along the line A-A shown in FIG. 1A.
Figure 2A:
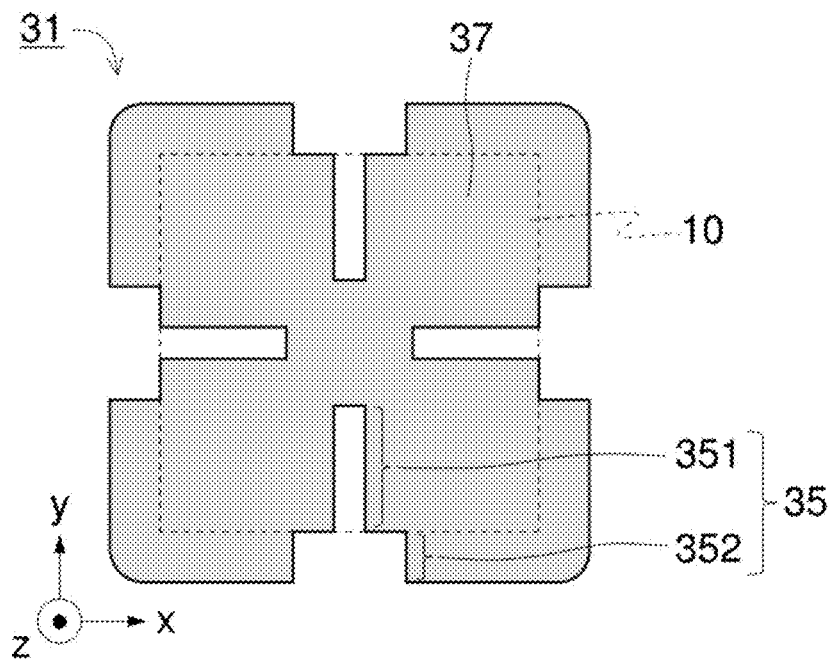
FIG. 2A is a plan view schematically showing a component support portion with openings of a semiconductor component support of the semiconductor device according to the embodiment of the present invention.
Figure 2B:
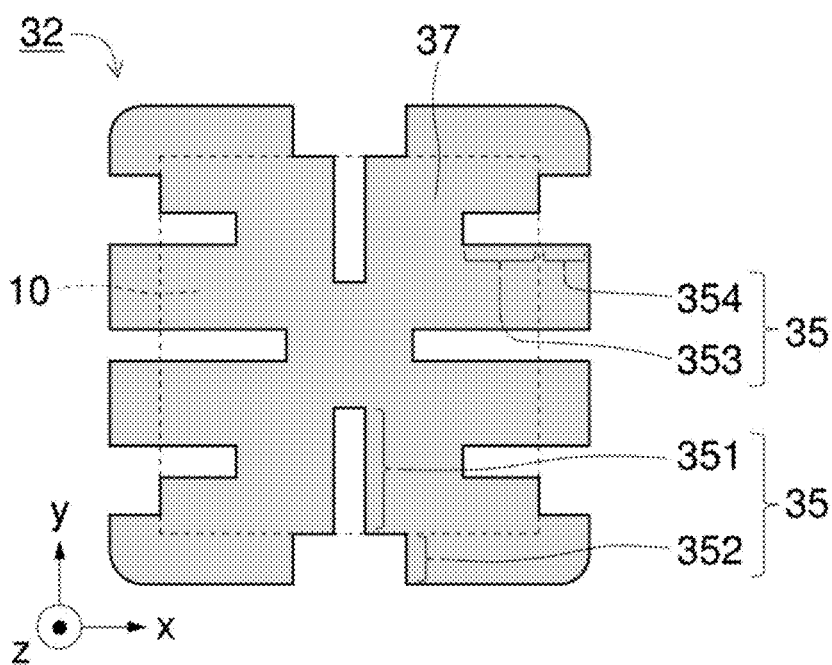
FIG. 2B is a plan view schematically showing a component support portion with openings according to a modified embodiment.
Figure 3A:
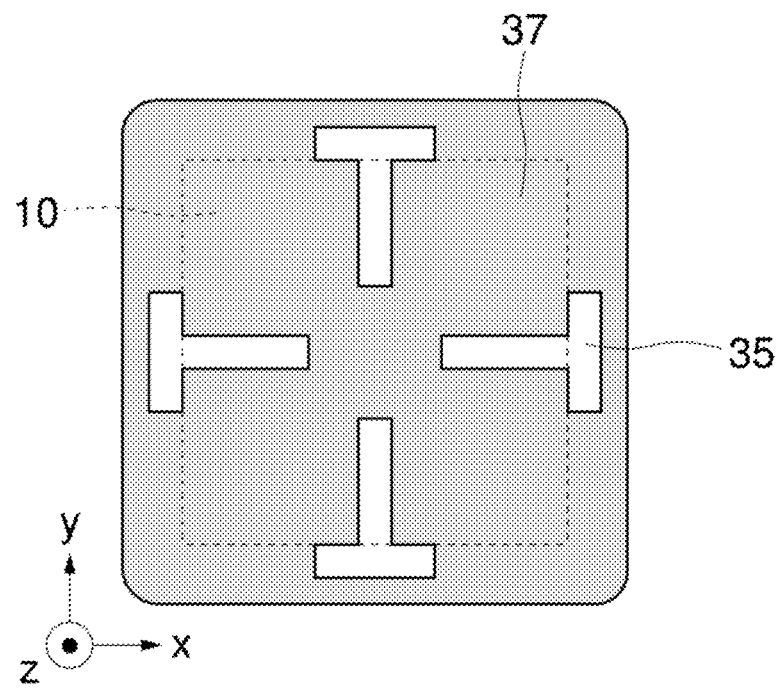
FIG. 3A is a plan view schematically showing a component support portion with openings of a semiconductor component support according to another modified embodiment of the present invention.
Figure 3B:
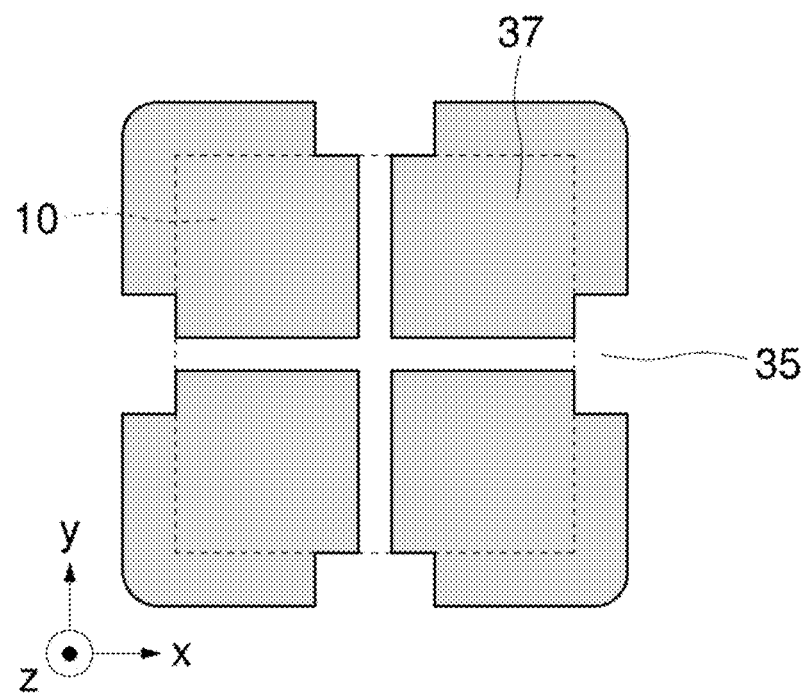
FIG. 3B is a plan view schematically showing a component support portion with openings of a semiconductor component support according to still another modified embodiment of the present invention.

FIG. 1A is a plan view schematically showing a semiconductor device 100 according to a first embodiment of the present invention. FIG. 1B is a cross-sectional view of the semiconductor device taken along the line A-A shown in FIG. 1A. FIG. 2A is a plan view schematically showing a component support portion of the semiconductor device according to the first embodiment of the present invention. FIG. 2B is a plan view schematically showing a component support portion according to a modified embodiment. FIGS. 3A and 3B are plan views schematically showing component support portions with openings of semiconductor component supports according to modified embodiments of the present invention.

As shown in FIGS. 1A and 1B, the semiconductor device 100 according to the first embodiment includes a semiconductor component 10, a semiconductor component support 20 (hereinafter, occasionally referred to as "support"), a bonding member 40, and a sealing member 50. The semiconductor component 10 is joined to a component support portion 31 of the support 20 by the conjugation member 40. The semiconductor component and the support are sealed by the sealing member 50. Thus, the semiconductor device 100 is produced.

More specifically, the semiconductor device 100 according to this embodiment is a light emitting device. The semiconductor component 10 is a light emitting component. The semiconductor component 10 includes a substrate 11, a functional structure 13, and a metal film 15. The functional structure is arranged on the top side of the substrate 11. The metal film is arranged on the bottom side of the substrate 11. The metal film 15 is substantially entirely formed on the bottom surface of the substrate 11. Alternatively, the metal film is formed into a shape that has a similar outline to the bottom surface of the substrate 11.

The support 20 is a package, which has an electrically insulating base 25. The package has a recessed portion. The component support portion 31 and wiring terminal portions are arranged in the recessed portion. The metal film 15 of the semiconductor component 10 is joined to the component support portion 31 by the bonding member 40. The functional structure 13 includes p-side and n-side electrodes that are connected to the wiring terminal portions through wire lines. The sealing member 50 is formed of a transparent resin. The recessed portion is filled up with the transparent resin so that the transparent resin reaches the top opening plane of the recessed portion. As shown in FIGS. 2A and 2B, the component support portion 31 or 32 includes a metal part 37 that includes openings 35 in plan view. Each of the openings 35 of the metal part includes a first section 351 or 353, and a second section 352 or 354. The second section communicates with the first section, and is arranged outside the first section. The second section 352 or 354 is wider than the first section 351 or 353. The first section 351 or 353 of each of the openings 35 is at least partially positioned directly under a mount-side main surface (the bottom surface in the embodiment) of the semiconductor component 10. The openings 35 of the component support portion can be formed by using a mask or by etching in pattern printing or sputtering technology. The openings can be also formed by attaching a thin plate with a metal film having a predetermined shape. In addition, the openings can be formed by any suitable methods.

The opening 35 refers to an area in plan view that is formed as if by partially cutting out a roughly rectangular metal part so that the roughly rectangular metal part is formed into the metal part 37 of the component support portion 31 or 32. More specifically, the opening 35 is an exposed part of the base material of the electrically insulating base 25, a recessed part or groove of a lead frame, or the like. The openings 35 may be arranged inside the metal part 37, as shown in FIG. 3A. The openings 35 may extend from one side to another side of the metal part, as shown in FIG. 3B. In this opening shown in FIG. 3B, the first sections of the openings 35 communicate with each other.

According to the component support portion 31 or 32, the second section 352 or 354 wider than the first section 351 or 353 provides a self-alignment effect of the semiconductor component 10 when the bonding member 40 is melted and then solidified. As a result, it is possible to surely position the semiconductor component 10 at a desired position or orientation. The first sections 351 or 353 are positioned directly under the semiconductor component 10 when the semiconductor component is mounted to the component support portion. Only a small amount of bonding member 40 or almost no bonding member will be provided on the first section 351 or 353. For this reason, gas (e.g., volatile compound of flux) can be discharged through the space of the first section 351 or 353. As a result, it is possible suppress appearance of voids. Therefore, it is possible to provide a large connection area of the semiconductor component 10. In addition, the second sections 352 or 354 wider than the first sections 351 or 353 are located on the outline of the semiconductor component 10. As a result, it is possible to facilitate the discharge of gas (e.g., volatile compound of flux).

In order that the semiconductor component 10 can be arranged inside the second sections 352 or 354, the component support portion 31 or 32 is dimensioned larger than the semiconductor component 10. The melted bonding member 40 will partially spread over a part (peripheral part) of the metal part 37 that is located outside the semiconductor component 10 (or the outline of one rectangular shape discussed later) in the plan view of the component support portion 31 or 32 when the semiconductor component is mounted to the component support portion. The spreading part of the bonding member does not allow the inclination of the semiconductor component 10, or can form a fillet part whereby increasing bonding strength between the semiconductor component 10 and the component support portions 31 or 32.

The semiconductor component support 20 and the semiconductor device 100 are now described in more detail.

As shown in FIG. 2A or 2B, the component support portion 31 or 32 has at least one pair of openings 35 that are arranged at symmetrical locations with respect to the center line in the vertical direction (y-direction in FIG. 2A or 2B) of the metal part 37, and at least one pair of openings 35 that are arranged at symmetrical locations with respect to the center line in the horizontal direction (x-direction in FIG. 2A or 2B) of the component support portion, in plan view. Each of the first sections 351 or 353 is at least partially arranged inside one rectangular outline (virtual rectangular area). Typically, semiconductor components to be used as the semiconductor component 10 have a rectangular outline mount-side main surface. Accordingly, the aforementioned component support portion 31 or 32 can provide the above working effects to most types of semiconductor components to be used as the semiconductor component 10.

It is preferable that the second sections 352 or 354 partially agree with the rectangular outline mount-side main surface of the semiconductor component 10 (or the aforementioned one rectangular outline) as shown in FIG. 2A or 2B. According to this construction, it is possible to provide the self-alignment effect of the semiconductor component 10 that allows the outline mount-side main surface of the semiconductor component 10 to agree with parts of the outlines of the second sections 352 or 354 when the bonding member 40 is melted and then solidified. As a result, it is possible to more surely position the semiconductor component 10 at a desired position or orientation. The "parts of the outlines of the second sections 352 or 354" refer to sides or arcs of the outlines of the second sections that extend from the first sections 351 or 353, and preferably to sides or arcs of the outlines of the second sections that extend in the width directions directly from the ends of the first sections 351 or 353. The term "to agree with" refers to that a part of one outline substantially agrees with a part of another outline in plan view.

As shown in FIG. 2A or 2B, the second section 352 or 354 is arranged on the outermost area of the component support portion 31 or 32. However, the second section may be arranged inside the metal part 37 as discussed above. In the case where the second section is arranged on the outermost area of the component support portion 31 or 32, it is possible to further facilitate the discharge of gas (e.g., volatile compound of flux) from the first section 351 or 353 as compared with the case where the second section is arranged inside the metal part. In addition, in this case, it is possible to reduce the size of the component support portion 31 or 32 and to efficiently join the semiconductor component 10 to the component support portion. In particular, in the case where the semiconductor component 10 having a rectangular mount-side main surface is mounted onto the component support portion, it is preferable that the openings 35 (second sections 352 or 354) extend inward from at least opposed two sides of the component support portion 31 or 32 having a rectangular exterior shape.

As shown in FIG. 2A or 2B, the second section 352 of the opening extends toward the both sides from the first section 351 of the opening. According to this construction, it is possible to further facilitate the discharge of gas (e.g., volatile compound of flux) from the first section 351. The component support portion 32 shown in FIG. 2B further includes the second sections 354 each of which extends toward only one side from the first section 353, in four openings 35. This type of opening 35 can be small but can provide both the effect for self-alignment of the semiconductor component 10, and the effect for suppress of void appearance in the bonding member 40.

As shown in FIGS. 2A and 2B, a part of the outline of the second section 352 or 354 extends in a direction substantially perpendicular to the extension direction of the first section 351 or 353. This second section 352 or 354 can surely provide the self-alignment effect. Alternatively, a part of the outline of the second section may extend in a slanting direction relative to the extension direction of the first section. In this case, the angle between the extension direction of the first section and the extension direction of this part of the outline of the second section falls within the range between 45° and 90° for example.

As shown in FIG. 2A or 2B, the first sections 351 extend toward the center of the component support portion 31. Gas (e.g., volatile compound of flux) is likely to remain a location that is spaced away from the exterior edges and the openings 35 of the metal part 37 (if the opening 35 is not provided, gas is likely to remain the central part of the component support portion 31 or 32). For this reason, the first sections 351 are constructed extending toward the center of the component support portion 31 so that it is possible to facilitate the discharge of gas (e.g., volatile compound of flux).

As shown in FIG. 2A or 2B, the first sections 351 or 353 are formed in a straight or rectangular shape (but may have a rounded end). According to this construction, the opening can be shortest from the inside end of the opening to the exterior side of the semiconductor component 10. Accordingly, it is possible to further facilitate the discharge of gas (e.g., volatile compound of flux) from the first section 351 or 353. Alternatively, the first section may be formed into a curved shape, an S shape, an L shape or the like.

As shown in FIG. 2A or 2B, the metal part 37 is formed in a single part. That is, although the openings 35 extend in the metal part 37, the openings do not divide the metal part so that the metal part is formed in a single part. According to this construction, the bonding member 40 will not be unevenly distributed on the component support portion 31 or 32. Accordingly, the connection area between the bonding member and the semiconductor component 10 can be large, while the semiconductor component will not be inclined. In particular, it is preferable that the a single part include a circular central area of the component support portion 31 or 32 (for example, an area that is enclosed by a virtual inscribed circle that is tangent to each of the inside ends of the first sections 351 or 353). In the case where a cross-shaped opening or a transverse straight opening extends from one side to another side of the component support portion for example and divides the component support portion into a plurality of parts, it is preferable that the parts have the same size.

As shown in FIG. 2A or 2B, the openings 35 are arranged at symmetrical locations with respect to the center line of the component support portion 31 or 32. According to this construction, the second sections 352 or 354 can sandwich or enclose the semiconductor component 10. As a result, it is possible to more surely position the semiconductor component 10 at a desired position or orientation. In addition, gas (e.g., volatile compound of flux) can be easily discharged through large areas of the component support portion 31 or 32. Also, in the case where one pair of openings 35 are arranged at symmetrical locations with respect to the center vertical or horizontal line of the component support portion 31 or 32, or in the case where two pairs openings are arranged at symmetrical locations with respect to both the center vertical and horizontal lines of the component support portion, it is possible to further more surely position the semiconductor component 10 at a desired position or orientation. Also, two or more openings 35 can be formed on one side edge of the metal part 37 as shown in FIG. 2B.

As shown in FIG. 2A or 2B, the component support portion 31 or 32 has a rectangular roughly shape in plan view. The second section 352 or 354 is formed on the outermost area of the component support portion 31 or 32, and is spaced away from corners of the metal part 37. This second section 352 or 354 can surely provide the self-alignment effect.

The semiconductor component support is constructed of the electrically insulating base, and the component support portion. The component support portion is formed on the electrically insulating base. The base can have a recessed part or a through hole that is positioned directly under the opening. According to this construction, the recessed part or through hole facilitates the discharge of gas (e.g., volatile compound of flux). As a result, it is possible surely suppress appearance of voids. This effect can be ensured in the case where the recessed part or through hole is arranged directly under the first section. Also, the recessed part or through hole may be formed directly under the second section. In this case, the outline of the second section can surely serve as the edge. Accordingly, it is possible to surely provide the effect for self-alignment of the semiconductor component. As a result, it is possible to further more surely position the semiconductor component at a desired position or orientation. In addition, the recessed part or through hole may be formed directly under both of the first and second sections. In this case, it is possible to both the aforementioned effects. The recessed part or through hole can be formed by etching, scribing, cutting, attachment of a thin plate having a predetermined shape onto the base, or the like.

It is preferable that the total area of parts, which can be the first sections 351 and 353, of the openings 35 of the component support portion that are positioned directly under the semiconductor component 10 be not less than 5% and not more than 40% of the area of the mount-side main surface of the semiconductor component 10, and more preferably not less than 10% and not more than 30% of the area of the mount-side main surface of the semiconductor component. In the case where the total area of parts of the openings that are positioned directly under the semiconductor component falls within the above range, it is possible to surely provide the aforementioned effect while providing a large connection area between the component support portion and the semiconductor component.

According to the semiconductor device that includes the semiconductor component 10 that is mounted on the aforementioned component support portion 31 or 32 of the support 20, the connection area between the semiconductor component 10 and the component support portion 31 or 32 can be large, and the semiconductor component can be mounted at a desired position or orientation. Accordingly, it is possible to provide a semiconductor device that has good electrical characteristics, good light distribution characteristics, good heat dissipation characteristics, high reliability, or the like. In the case where of a light emitting device that includes a light emitting component as the semiconductor component 10, since the device can have the above characteristics, the device can be high power and long life, and can serve as a light source that can be easily optically adjusted. In particular, in the case where the light emitting device includes a wavelength conversion material such as phosphor, it is preferable that the wavelength conversion material is only arranged in proximity to the light emitting component whereby providing a nearly "point light source".

Elements of the semiconductor component support and the semiconductor device according to the present invention are now described.

(Semiconductor Component 10)

The semiconductor component 10 includes at least the substrate 11 and the functional structure 13. The semiconductor component 10 can be a light emitting component such as light emitting diode (LED) and semiconductor laser (LD), or an electronic component such as transistor and thyristor. It is preferable that the mount-side main surface of the semiconductor component 10 be formed in a quadrangular shape, in particular, a rectangle or square. However, the mount-side main surface of the semiconductor component can be formed in any shape. The semiconductor component 10 (in particular, the substrate 11) can have roughly vertical side surfaces, or inwardly-inclined or outwardly-inclined side surfaces. It is preferable that the semiconductor component 10 includes the p-side and n-side electrodes that are arranged on the top and bottom surfaces of the component, in other words, has top-and-bottom electrode structure (opposed electrode structure). In particular, in the case of opposed electrode structure, the present invention is effective. The reason is that connection between the mount-side main surface and the component support portion has influence on the electrical characteristics, the heat dissipation characteristics, the reliability, or the like of the component. However, the semiconductor component 10 can include the p-side and n-side electrodes that are arranged on the one surface side of the component. In the case where the p-side and n-side electrodes are arranged on the one surface side, although the semiconductor component can be mounted in a face-up or face-down mounting manner, the present invention is effective for the face-up mounting manner. The reason is that voids are relatively likely to appear in the face-up mounting manner.

(Substrate 11)

The substrate 11 can be a crystal growth substrate that allows a semiconductor crystal of the functional structure 13 to grow on the crystal growth substrate, or a support substrate on which the functional structure 13 is joined after the functional structure is removed from the crystal growth substrate. In the case where the substrate 11 is electrically conductive, the semiconductor component can have the top-and-bottom electrode structure (opposed electrode structure). This structure facilitates electric current to uniformly spread in plane of the functional structure 13 whereby increasing the power efficiency of the semiconductor component. Examples of crystal growth substrates can be provided by sapphire, spinel, gallium nitride, aluminum nitride, silicon, silicon carbide, gallium arsenide, gallium phosphide, indium phosphide, zinc sulfide, zinc oxide, zinc selenide, diamond, and the like. It is preferable that a non-transparent substrate be used as the support substrate.

Most non-transparent substrates have good thermal conductivity, and can improve the heat dissipation characteristics of the semiconductor component 10. Examples of support substrates can be provided by silicon, silicon carbide, aluminum nitride, copper, and copper-tungsten, gallium arsenide, ceramics, and the like. Silicon, silicon carbide, or copper-tungsten is preferably used as the support substrate from the viewpoint of thermal expansion coefficient difference between the support substrate and the functional structure 13. On the other hand, silicon or copper-tungsten is preferably used as the support substrate from the viewpoint of cost. For example, the substrate 11 has a thickness of not smaller than 20 µm and not greater than 1000 µm, preferably not smaller than 50 µm and not greater than 500 µm from the viewpoint of the strength of the substrate 11 and the thickness of the semiconductor device 100.

(Functional Structure 13)

The functional structure 13 is constructed of semiconductor layers, and includes at least n-type and p-type semiconductor layers. It is preferable that an active layer be interposed between the n-type and p-type semiconductor layers. The functional structure can include electrodes and a protection film. The electrodes can be formed of the same materials as the metal film 15 (discussed later). The protection film can be formed of oxide that includes at least one element selected from the group consisting of silicon, titanium, zirconium, niobium, tantalum, and aluminum. In the case where a light emitting component is used as the semiconductor component 10, the light wavelength of the functional structure 13 can be selected from ultraviolet to infrared radiation according to the semiconductor material or the mixture ratio of semiconductor materials of the functional structure. The semiconductor materials of the functional structure are preferably formed of nitride group semiconductors (mainly represented by general formula $In_xAl_yGa_{1-x-y}N$ ($0 \leq x$, $0 \leq y$, $x+y \leq 1$)), which can emit light with a short wavelength capable of efficiently exciting phosphors. Also, the functional structure can be formed of InAlGaAs group semiconductor, InAlGaP group semiconductor, zinc sulfide, zinc selenide, silicon carbide, or the like.

(Metal Film 15)

The metal film 15 is arranged on the bottom surface of the substrate 11. Accordingly, it is possible to increase the bonding strength between the semiconductor component 10 and the support 20. Also, high bonding strength can be easily provided even at low temperature. In the case where the metal film 15 has a similar shape (plan view shape) to the shape (plan view shape) of the metal part of the component support portion 31 or 32, it is possible to facilitate both the self-alignment effect of the semiconductor component 10, and the effect for suppress of void appearance in the bonding member 40. Examples of materials of the metal film 15 can be provided by gold, silver, tin, platinum, titanium, aluminum, tungsten, palladium, nickel, and alloys of at least two of them. The metal film 15 can be formed in a single layer film or a multilayer film. The metal film 15 can be formed by sputtering, plating, vapor deposition, or the like. The metal film 15 can be omitted so that the bottom surface of the substrate 11 can be in contact with the bonding member 40.

(Support 20)

The support 20 includes the component support portion 31 or 32. The support 20 typically includes the component support portion 31 or 32, and the base 25. The support 20 can include a recessed portion (cup portion), or can be constructed of a flat plate, or the like. In the case where the support includes a recessed portion (cup portion), this support can facilitate improvement in light outgoing efficiency. In the case where the support is constructed of a flat plate, the semiconductor component 10 can be easily mounted onto this support. Typically, the former serves as a package, while the latter serves as wiring board. The support may be a lead frame that serves as both the component support portion and the base as in lamp type (bullet type) semiconductor devices (light emitting devices). Also, a submount may be used as the support 20.

(Base 25)

The base 25 holds the component support portion 31 or 32. In the case where the base 25 serves as package, the base can be a package that includes a board or a printed circuit board on this package. Also, the base can be a package including wiring that is formed on the package after the package is formed by molding. Also, the base can be a package that is integrally formed with a lead frame. Also, other types of package can be used as the base. Examples of materials of the base 25 that serves as package can be provided by thermoplastic resins (e.g., polyphthalamide and liquid crystal polymer), thermosetting resins (e.g., epoxy resin), glass epoxy, ceramics (discussed later), and the like. In order to efficiently reflect light that is emitted from the semiconductor component 10, white pigment (e.g., titanium oxide) can be mixed into the aforementioned resin. The package can be formed by insert molding, injection molding, extrusion, transfer molding, or the like. Examples of materials of the base 25 that serves as a wiring board can be provided by ceramic boards containing aluminum oxide, aluminum nitride, zirconium oxide, zirconium nitride, titanium oxide, titanium nitrides or mixture of at least two of them, metal bases containing copper, iron, nickel, chromium, aluminum, silver, gold, titanium or an alloy of at least two of them, glass epoxy board, BT resin board, glass board, resin board, paper board, and the like. The base can be constructed of flexible board (flexible base) such as polyimide.

(Component Support Portion 31, 32)

The component support portion 31 or 32 includes the openings 35, and the metal part 37. The component support portion 31 or 32 may consist of the openings 35, and the metal part 37. The metal part 37 is a part or member that is formed of a metal. The semiconductor component 10 is mounted on the metal part. The component support portions 31 or 32 can be formed similar to the wiring terminal portion, or integrally with the wiring terminal portion. For example, a so-called "land", "die-pad", or the like can be used as the component support portion 31 or 32. Specifically, the metal part 37 can be a lead frame or wiring that is formed of copper, aluminum, gold, silver, tungsten, palladium, iron, nickel, cobalt, molybdenum, chromium, titanium, an alloy of at least two of them, phosphor bronze, copper containing iron, or the like. In the case where wiring is used as the metal part, the metal part can be a single layer film or multilayer film that is formed of the above material(s). In addition, the surface of the metal part can be covered by plating or light reflection film formed of silver, aluminum, rhodium, gold, copper, an alloy of at least two of them, or the like. Alternatively, the metal part 37 can be formed by presswork or etching on a metal member that serves as the bases 25 (e.g., lead frame).

(Bonding Member 40)

The semiconductor component 10 is joined to the support 20 by the bonding member 40. The bonding member 40 contains metal such as gold, tin, silver, copper, zinc, bismuth, indium or antimony, and can contain resin or organic solvent as flux. Examples of the bonding member can be provided by various types of solder and metal paste, such as tin-bismuth group, tin-zinc group, tin-copper group, tin-silver group and golden-tin group solder or metal paste materials. The "bonding member" refers to the bonding member in the both states before melted or solidified, and after solidified.

(Sealing Member 50)

The sealing member 50 encloses the semiconductor component 10, the wire lines, the component support portion 31 or 32, and the wiring terminal portion, the bonding member 40 and the like whereby protecting them from dust, external force and the like. The sealing member 50 is formed of an electrically insulating base material that is transparent to the light that is emitted from the functional structure 13 (preferably has transmittance of not less than 70%). Examples of the base material of the sealing member can be provided by silicone resin, denatured silicone resin, modified silicone resin, epoxy resin, phenol resin, polycarbonate resin, acrylate resin, TPX resin, polynorbornene resin, and hybrid resin containing one or more types of these resins. The base material of the sealing member can be glass. In particular, it is preferable that the base material of the sealing member be silicone resin. The reason is that silicone resin has good heat resistance and good light resistance, and that the volumetric shrinkage of silicone resin is small after solidified.

The sealing member 50 can contain various types of functional particles (e.g., filler, phosphor, etc.) that are mixed into the base material. A diffusing agent, a coloring agent, and the like can be used as the filler. Examples of the filler can be provided by silica, titanium oxide, magnesium oxide, magnesium carbonate, magnesium hydroxide, calcium carbonate, calcium hydroxide, calcium silicate, zinc oxide, barium titanate, aluminum oxide, iron oxide, chrome oxide, manganese oxide, glass, carbon black, and the like. The filler can have granular shapes or spherical shapes. The filler can be hollow particles or porous particles. The phosphor absorbs at least part of the primary light emitted from the functional structure 13, and emits secondary light with different wavelength from the primary light. Examples of the phosphors can be provides by yttrium aluminum garnet (YAG) activated by cerium, calcium aluminosilicate ($CaO-Al_2O_3-SiO_2$) containing nitrogen activated by europium and/or chromium, silicate ($(Sr, Ba)_2SiO_4$) activated by europium, and the like. According to this construction, it is possible to provide a light emitting device that can emit primary light with a visible wavelength and secondary light with another visible wavelength whereby emitting mixed color light (e.g., white-range light). Also, it is possible to provide a light emitting device that can emit secondary light with a visible wavelength, which is excited by primary light with an ultraviolet wavelength.

EXAMPLES

The following description will describe semiconductor devices according to examples. However, needless to say, the present invention is not limited to the examples described below. The dimensions shown below are values in the design drawing.

Example 1

The semiconductor device according to an example 1 is a surface mount type package LED having the construction shown in FIG. 1.

The support is a roughly rectangular parallelepiped package having length of 3.5 mm, width of 3.5 mm, and thickness of 0.875 mm. The package has a two-stepped recessed portion that opens upward and located in the central part of the package. The upper stepped part has a circular opening with diameter of 2.8 mm, and depth of 0.5 mm. The lower stepped part has a roughly square-shaped opening (having rounded corners) with length of 1.3 mm, width of 1.3 mm and depth of 0.1 mm. The base of this package is formed of alumina ceramic. The component support portion is arranged on the bottom of the lower stepped part, and has a similar exterior shape to the lower stepped part in plan view. In the case where the component support portion is arranged in the recessed portion, it is possible to prevent undesired short circuit between the component support portion and the wiring terminal portions, or attachment of flux or the like, which will be produced from the bonding member, with the wiring terminal portion or the like. The positive and negative electrode wiring terminal portions are arranged on the bottom of the upper stepped part, and surround the component support portion. The component support portion and the wiring terminal portions are formed of tungsten, nickel, and gold that are deposited in this order. The top gold layer has a thickness of 0.5 µm. The positive and negative electrode wiring terminal portions are electrically connected to external connection terminals, which are exposed from the bottom surface of the support.

Each of the sides of the roughly square-shaped component support portion has the opening, which extends from substantially the center of the side as shown in FIG. 2A. The base is exposed through the opening as the bottom surface of the opening. The second section has a rectangular shape with width of 0.3 mm and length of 0.15 mm. The second section is formed on the outermost area (edge) of the component support portion. The first section has a rectangular shape with width of 0.1 mm and length of 0.35 mm. The first section extends from the center of the second section toward the center of the component support portion. That is, the second section is wider than the first section. Accordingly, a part of the outline of the second section extends from the first section in the width direction. The extension amount of the extension part of the outline of the second section is 0.1 mm in a direction substantially perpendicular to the extension direction of the first section. Thus, the opening has a roughly T shape in plan view. The extension parts of the outlines of the four second sections, which extend from the first section in the width direction, in the four openings agree with the outline of one square having length of 1 mm and width of 1 mm. The metal part of the component support portion occupies 86% of the area of the one square having length of 1 mm and width of 1 mm.

The semiconductor component has a roughly rectangular parallelepiped package having length of 1 mm, width of 1 mm, and thickness of 0.15 mm. The semiconductor component is an LED chip, which emits ultraviolet light with center wavelength falling within the range of 385 to 405 nm. The LED chip includes the light emitting functional structure formed of nitride semiconductors on the upper surface side of the sapphire substrate. The metal film is arranged on the bottom surface side of the substrate. The metal film is formed of aluminum, tungsten, and platinum, which are deposited in this order. The metal film is formed on substantially the entire bottom surface of the substrate.

The semiconductor component is joined to the component support portion by the bonding member with the outline of the semiconductor component substantially agreeing with the parts of the outlines of the second sections of the openings that extend from the first sections in the width direction. The bonding member is formed of eutectic solder paste of gold-tin (manufactured by MITSUBISHI MATERIALS CORP.). In addition, the p-side and n-side electrodes of the semiconductor component are connected to the wiring terminal portions by the gold wire lines. The sealing member is formed of silicone resin. The recessed portion is filled up with the silicone resin so that the silicone resin reaches the top opening plane of the recessed portion.

Example 2

A semiconductor device according to an example 2 includes similar construction to the semiconductor device according to the example 1 except for openings of the metal part of the component support portion. As shown in FIG. 2B, the semiconductor device according to the example 2 includes eight openings. One opening is formed at substantially the center of each of the four sides (four edges) of the roughly square-shaped component support portion. One opening is formed at each of two locations between the center and the corners of each of the two right and left sides of the roughly square-shaped component support portion. The openings in the two top and bottom sides of the roughly square-shaped component support portion are the same as the example 1. The opening that is formed at substantially the center of the two right and left sides of the roughly square-shaped component support portion has a rectangular shape with width of 0.1 mm and length of 0.5 mm. The second section of the openings that is formed at each of two locations between the center and the corners of each of the two right and left sides of the roughly square-shaped component support portion has a rectangular shape with width of 0.2 mm and length of 0.15 mm. The second section is formed on the outermost area (edge) of the component support portion. The first section has a rectangular shape with width of 0.1 mm and length of 0.25 mm. The first section extends inward from one end of the second section. Thus, the opening has a roughly L shape in plan view. The six second sections of the six openings are wider than the first section. The extension parts of the outlines of the six second sections, which extend from the first section in the width direction, agree with the outline of one square having length of 1 mm and width of 1 mm. The metal part of the component support portion occupies 76% of the area of the one square having length of 1 mm and width of 1 mm.

Comparative Example 1

Figure 4:
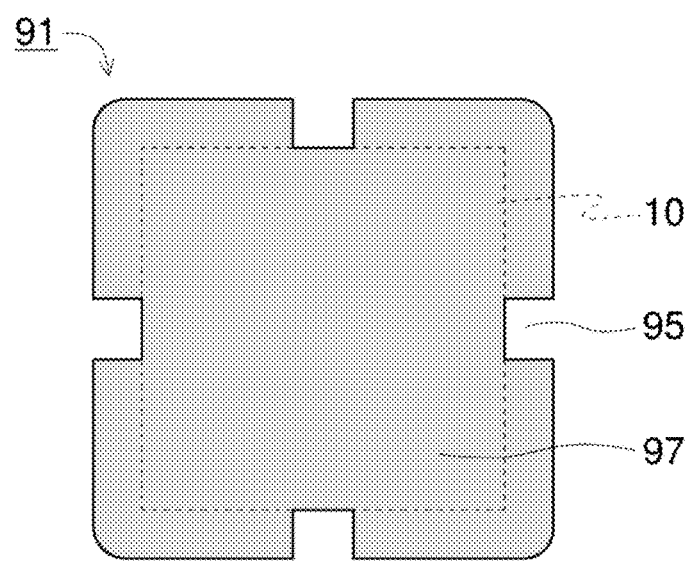
FIG. 4 is a plan of a component support portion of a semiconductor component support according to a comparative example.

A semiconductor device according to a comparative example 1 includes similar construction to the semiconductor device according to the example 1 except for openings of the metal part of the component support portion. FIG. 4 is a plan showing a component support portion according to the comparative example 1. Each of the sides of a roughly square-shaped component support portion 91 according to the comparative example 1 has one opening 95, which is formed in substantially the center of the side as shown in FIG. 4A. The opening 95 has a rectangular shape with width of 0.15 mm and length of 0.15 mm. The opening is formed on the outermost area (edge) of the component support portion 91 (metal part 97). The opening has only this rectangular shape, which corresponds to the second section. Thus, when the semiconductor component is joined to the component support portion 91, the openings 95 are not located directly under the semiconductor component.
<Evaluation>

The connection areas of the semiconductor components in the semiconductor devices according to the examples 1 and 2, and the comparative example 1 are obtained by an X-ray inspector (TUX-3200 manufactured by MARS TOHKEN X-RAY INSPECTION Co., LTD.). The connection state between the semiconductor component and the component support portion is evaluated. The diameter of applied bonding member (paste) is 500 μm. Reflowing is conducted under the conditions of maximum temperature of 327° C., and heat time of 86 seconds (over 280° C.). The connection area is calculated by subtracting the total area of voids from the area of the mount-side main surface of the semiconductor component, where the area of the mount-side main surface of the semiconductor component is defined as 100%. In the calculation of the connection area, the openings of the component support portion that are positioned directly under the semiconductor component are defined as the voids.

In the example 1, the average connection area of the semiconductor component is 64.5%, and the standard deviate (a) is 1.7%. In the example 2, the average connection area of the semiconductor component is 63.3%, and the standard deviate (σ) is 1.1%. In the comparative example 1, the average connection area of the semiconductor component is 56.2%, and the standard deviate is 5.7%. In addition, all of the semiconductor devices according to the examples 1 and 2, and the comparative example 1 are suitably positioned and orientated.

It is found that the connection areas of the semiconductor components according to the examples 1 and 2 are larger than the connection area of the semiconductor component according to the comparative example 1. This means that gas (e.g., volatile compound of flux) is smoothly discharged whereby providing the semiconductor component with a large connection area. The total area of voids becomes smaller in order of comparative example 1>example 1>example 2. According to this test, it is found that although increase of the area of the opening in the component support portion reduces the area of the metal part and the connection area, the increase of the area of the opening facilitated the discharge of gas (e.g., volatile compound of flux).

A semiconductor component support and a semiconductor device according to the present invention can be used as back light source for liquid crystal display, various types of lighting apparatuses, large size display, and various types of displays for advertisement, information sign, etc., as well as image scanner for digital video camera, facsimile, copier, scanner, etc., optical stepper, projector, and the like.

It should be apparent to those with an ordinary skill in the art that while various preferred embodiments of the invention have been shown and described, it is contemplated that the invention is not limited to the particular embodiments disclosed, which are deemed to be merely illustrative of the inventive concepts and should not be interpreted as limiting the scope of the invention, and which are suitable for all modifications and changes falling within the scope of the invention as defined in the appended claims. The present application is based on Application No. 2012-160043 filed in Japan on Jul. 18, 2012, the content of which is incorporated herein by reference.

What is claimed is:

1. A light emitting semiconductor component support comprising:
    a component support portion for a light emitting semiconductor component to be mounted on the component support portion,
    wherein said component support portion includes a metal part in a film shape that includes openings in plan view,
    wherein each of said openings of the metal part includes a first section, and a second section that communicates with said first section and is arranged outside said first section, the second section being wider than said first section, wherein said component support portion is larger than a mount-side main surface of the light emitting semiconductor component that is arranged on or above said component support portion, and said first section is formed linearly with a substantially constant width directly under the mount-side main surface of the light emitting semiconductor component, wherein a part of an outline of said second section extends from said first section in a direction substantially perpendicular to an extension direction of said first section, and the part of the outline of said second section aligns with one rectangular outline where said light emitting semiconductor component is arranged, wherein said metal part of said component support portion has a continuous plane area that extends among said openings, and wherein the total area of parts of the openings of the component support portion that are positioned directly under the light emitting semiconductor component is not less than 10% and not more than 30% of the area of the mount-side main surface of the light emitting semiconductor component.

2. A light emitting semiconductor component support comprising:

a component support portion for a light emitting semiconductor component to be mounted on the component support portion, wherein said component support portion is larger than a mount-side main surface of the light emitting semiconductor component that is arranged on or above said component support portion, wherein said component support portion includes a metal part in a film shape that includes at least two pairs of openings in plan view, wherein one of the pairs of openings are arranged at symmetrical locations with respect to the center vertical line of said component support portion, and another pair of openings are arranged at symmetrical locations with respect to the center horizontal line of said component support portion, wherein each of the openings includes
a first section, and
a second section that communicates with said first section and is arranged outside said first section, the second section being wider than said first section, wherein each first section is formed in a linear shape inside one rectangular outline, wherein a part of an outline of said second section extends from said first section in a direction substantially perpendicular to an extension direction of said first section, and the part of the outline of said second section aligns with the one rectangular outline where said light emitting semiconductor component is arranged, wherein said metal part of said component support portion has a continuous plane area that extends among said openings, and wherein the total area of parts of the openings of the component support portion that are positioned directly under the light emitting semiconductor component is not less than 10% and not more than 30% of the area of the mount-side main surface of the light emitting semiconductor component.

3. The light emitting semiconductor component support according to claim 1, wherein said second section is formed on the outermost area of said component support portion.

4. The light emitting semiconductor component support according to claim 1, wherein said second section extends toward the both sides from said first section.

5. The light emitting semiconductor component support according to claim 1, wherein said first section extends toward the center of said component support portion.

6. The light emitting semiconductor component support according to claim 1, wherein said first section extends in a straight shape.

7. The light emitting semiconductor component support according to claim 1, wherein said openings does not divide said metal part so that said metal part is formed in a single part.

8. The light emitting semiconductor component support according to claim 1, wherein the openings are arranged at symmetrical locations with respect to the center line of said component support portion.

9. The light emitting semiconductor component support according to claim 1, wherein said component support portion has a roughly rectangular shape in plain view,
wherein said second section is formed on the outermost area of said component support portion, and is spaced away from corners of said metal part.

10. The light emitting semiconductor component support according to claim 1 further comprising an electrically insulating base that holds said component support portion on the electrically insulating base,
wherein said base has a recessed part or a through hole that is positioned directly under said openings.

11. The light emitting semiconductor component support according to claim 1, wherein the part of the outline of said second section that aligns with the one rectangular outline is an edge of the metal part defining a portion of the second section.

12. The light emitting semiconductor component support according to claim 1, further comprising a base provided with said component support portion and wiring terminal portions connected in communication to an outside of said light emitting semiconductor component support.

13. The light emitting semiconductor component support according to claim 1,
wherein the light emitting semiconductor component is a light emitting diode or a semiconductor laser, and
wherein the part of the outline of said second section aligns with the one rectangular outline where said light emitting diode or said semiconductor laser is arranged.

14. The light emitting semiconductor component support according to claim 2, wherein two or more second sections are provided as said second section, and partially align with said one rectangular outline.

15. The light emitting semiconductor component support according to claim 2, wherein said second section is formed on the outermost area of said component support portion.

16. The light emitting semiconductor component support according to claim 2, wherein said second section extends toward the both sides from said first section.

17. The light emitting semiconductor component support according to claim 2, wherein said first section extends toward the center of said component support portion.

18. The light emitting semiconductor component support according to claim 2, wherein said first section extends in a straight shape.

19. The light emitting semiconductor component support according to claim 2, wherein said opening does not divide said metal part so that said metal part is formed in a single part.

20. The light emitting semiconductor component support according to claim 2, wherein further comprising an electrically insulating base that holds said component support portion on the electrically insulating base,
wherein said base has a recessed part or a through hole that is positioned directly under said opening.

21. The light emitting semiconductor component support according to claim 2, wherein the part of the outline of said second section that aligns with the one rectangular outline is an edge of the metal part defining a portion of the second section.

22. The light emitting semiconductor component support according to claim 2, further comprising a base provided with said component support portion and wiring terminal portions connected in communication to an outside of said light emitting semiconductor component support.

23. The light emitting semiconductor component support according to claim 2,
wherein the light emitting semiconductor component is a light emitting diode or a semiconductor laser, and
wherein the part of the outline of said second section aligns with the one rectangular outline where said light emitting diode or said semiconductor laser is arranged.

24. A light emitting semiconductor device comprising a light emitting semiconductor component support including:
a component support portion for a light emitting semiconductor component to be mounted on the component support portion; and a light emitting semiconductor component that is arranged on or above said component support portion of the light emitting semiconductor component support,
wherein said component support portion includes a metal part in a film shape that includes openings in plan view,
wherein each of said openings of the metal part includes
a first section, and
a second section that communicates with said first section and is arranged outside said first section, the second section being wider than said first section,
wherein said first section is formed linearly with a substantially constant width directly under a mount-side main surface of the light emitting semiconductor component,
wherein a part of an outline of said second section extends from said first section in a direction substantially perpendicular to an extension direction of said first section, and the part of the outline of said second section aligns with one rectangular outline where said light emitting semiconductor component is arranged,
wherein said metal part of said component support portion has a continuous plane area that extends among said openings, and
wherein the total area of parts of the openings of the component support portion that are positioned directly under the light emitting semiconductor component is not less than 10% and not more than 30% of the area of the mount-side main surface of the light emitting semiconductor component.

25. The light emitting semiconductor device according to claim 24, wherein the part of the outline of said second section that aligns with the one rectangular outline is an edge of the metal part defining a portion of the second section.

26. The light emitting semiconductor device according to claim 24, further comprising a base provided with said component support portion and wiring terminal portions connected in communication to an outside of said light emitting semiconductor component support.

27. The light emitting semiconductor device according to claim 24,
wherein the light emitting semiconductor component is a light emitting diode or a semiconductor laser, and
wherein the part of the outline of said second section aligns with the one rectangular outline where said light emitting diode or said semiconductor laser is arranged.

28. A light emitting semiconductor device comprising a light emitting semiconductor component support including:
a component support portion for a light emitting semiconductor component to be mounted on the component support portion; and a light emitting semiconductor component that is arranged on or above said component support portion of the light emitting semiconductor component support,
wherein said component support portion includes a metal part in a film shape that includes at least two pairs of openings in plan view,
wherein one of the pairs of openings are arranged at symmetrical locations with respect to the center vertical line of said component support portion, and another pair of openings are arranged at symmetrical locations with respect to the center horizontal line of said component support portion,
wherein each of the openings includes
a first section, and
a second section that communicates with said first section and is arranged outside said first section, the second section being wider than said first section,
wherein each first section is formed in a linear shape inside one rectangular outline,
wherein a part of an outline of said second section extends from said first section in a direction substantially perpendicular to an extension direction of said first section, and the part of the outline of said second section aligns with the one rectangular outline where said light emitting semiconductor component is arranged,
wherein said metal part of said component support portion has a continuous plane area that extends among said openings, and
wherein the total area of parts of the openings of the component support portion that are positioned directly under the light emitting semiconductor component is not less than 10% and not more than 30% of the area of a mount-side main surface of the light emitting semiconductor component.

29. The light emitting semiconductor device according to claim 28, wherein the part of the outline of said second section that aligns with the one rectangular outline is an edge of the metal part defining a portion of the second section.

30. The light emitting semiconductor device according to claim 28, further comprising a base provided with said component support portion and wiring terminal portions connected in communication to an outside of said light emitting semiconductor component support.

31. The light emitting semiconductor device according to claim 28,
wherein the light emitting semiconductor component is a light emitting diode or a semiconductor laser, and
wherein the part of the outline of said second section aligns with the one rectangular outline where said light emitting diode or said semiconductor laser is arranged.

* * * * *